United States Patent [19]
Kondo et al.

[11] Patent Number: 5,541,023
[45] Date of Patent: Jul. 30, 1996

[54] X-RAY MASK, METHOD OF MANUFACTURING THE X-RAY MASK AND EXPOSURE METHOD USING THE X-RAY MASK

[75] Inventors: Kazuaki Kondo; Kenji Sugishima, both of Kawasaki, Japan

[73] Assignee: Fujitsu Limited, Japan

[21] Appl. No.: 67,623

[22] Filed: May 28, 1993

[30] Foreign Application Priority Data

May 29, 1992 [JP] Japan .................................. 4-139318

[51] Int. Cl.$^6$ .................................................. G03F 9/00
[52] U.S. Cl. ................... 430/5; 430/311; 378/34; 378/35; 156/630.1; 156/633.1
[58] Field of Search ............... 430/5, 311; 156/630, 156/633; 378/34, 35

[56] References Cited

U.S. PATENT DOCUMENTS 4,680,243  7/1987  Shimkunas et al. .................. 430/5
5,188,706  2/1993  Hori et al. .............................. 430/5

OTHER PUBLICATIONS

Japanese unexamined Publication (KOKAI) * The difference from the present invention is described in the prior art portion of the specification. Feb. 14, 1991.

*Primary Examiner*—S. Rosasco
*Attorney, Agent, or Firm*—Staas & Halsey

[57] ABSTRACT

An X-ray absorbing film including an X-ray absorbing pattern of an X-ray mask uses β-crystalline tantalum having the plane orientation of (002). The β-crystalline tantalum film is formed by depositing tantalum on an amorphous layer. Because the film stress change due to heat is small, the strain of the X-ray absorbing pattern formed through a thermal treatment process is decreased.

When heating the X-ray absorbing film before implanting ions into the film, the stress change of the film after implanted with ions decreases and the X-ray absorbing pattern strain also decreases.

13 Claims, 10 Drawing Sheets

TEMPERATURE: 200°C
GAS PRESSURE: P1 > P2 > P3 > P4 > P5 > P6

X-RAY MASK, METHOD OF MANUFACTURING THE X-RAY MASK AND EXPOSURE METHOD USING THE X-RAY MASK

BACKGROUND OF THE INVENTION

1. Field of the Invention

The present invention relates to an X-ray mask using an X-ray absorbing film such as tantalum (Ta), tungsten (W), or tantalum-tungsten alloy, to a method of manufacturing the same and to an exposure method using the X-ray mask.

2. Description of the Related Art

As a very large scale integrated circuit (VLSI) is more densified, a super-fine fabrication technique is being demanded. To form a pattern having a line width of 0.5 μm by lithography using an X-ray mask, an error due to a strain of an X-ray absorbing pattern of the X-ray mask should be decreased at least to 0.05 μm or less.

The X-ray mask is conventionally formed according to the process shown by the sectional views in FIG. 1. The following is the brief description of the process.

First, as shown in FIG. 1(a), a membrane 2 composed of silicon carbide (SIC) is formed on the top surface of a silicon (Si) substrate 1 by the low pressure CVD method. After a SiC film 3 is formed on the underside of the substrate, an opening 4 to expose the central portion of the silicon substrate is formed by patterning the SiC film 3 by lithography.

Then, as shown in FIG. 1(c), an X-ray absorbing film 5 composed of a material such as W or Ta is grown on the membrane 2 by the sputtering method, and then, after the Si substrate 1 is bonded with a support frame 6 through the SiC film 3, a window 7 for exposing the membrane 2 is formed by etching the Si substrate 1 through the opening 4 of the SiC film 3.

Then, as shown in FIG. 1(d), after a photoresist pattern 8 is formed on the X-ray absorbing film 5, patterning is applied to the X-ray absorbing film 5 by lithography techniques with the pattern 8 as a mask. And, when the photoresist pattern 8 is removed, the X-ray mask as shown in FIG. 1(e) is completed. Major strains in the X-ray mask manufacturing process described above are generated when patterning the X-ray absorbing film 5. The main cause of the strains is the stress of the X-ray absorbing film 5. To minimize the stress generated in depositing an X-ray absorber, various parameters such as the film-forming chamber pressure, discharge power and substrate temperature have been conventionally adjusted to form a film.

In general, the most effective method to control the stress of the X-ray absorbing film 5 is to change the pressure in the film-forming chamber in forming a film. However, as the result of controlling the pressure in the film-forming chamber in order to bring the stress of the X-ray absorbing film 5 close to zero, the film stress is greatly changed due to a slight change of the pressure. Therefore, the controllability is low.

For example, when it is assumed that the material of the X-ray absorbing film is Ta, as the result of forming an X-ray absorbing film of Ta having a film stress close to zero by adjusting the pressure in the film-forming chamber, the stress is greatly changed to a compressive stress due to thermal treatment and change with the passage of time as shown in FIG. 2. Therefore, the X-ray absorbing pattern formed by the Ta film has a problem that it is deformed due to the compressive stress. The compressive stress is expressed as a negative value in FIG. 2.

For example, the official gazette of Japanese Patent Laid-Open No. 34312/1991 proposes a method of implanting ions of elements such as argon (Ar) and krypton (Kr) into an X-ray absorbing film in order to decrease the change of compressive stress generated after forming a film. Though this method makes it possible to decrease the change of the stress of the X-ray absorbing film to a certain extent, further suppression of the stress change is desired. Moreover, this official gazette describes that ions are implanted in the X-ray absorbing film without thermally treating the film after the film is formed.

SUMMARY OF THE INVENTION

It is an object of the present invention to provide an X-ray mask having a pattern formed of an X-ray absorbing film having only a little stress change and its forming method.

It is another object of the present invention to provide an X-ray mask having a pattern of an X-ray absorbing film treated so that the stress change is small after the film is formed and .its forming method.

It is still another object of the present invention to provide an exposure method using an X-ray mask having a high pattern accuracy.

The present invention makes it possible to form an X-ray absorbing pattern composed of a β-crystalline Tantalum (β-Ta) film having a (002) plane as an X-ray absorber. Because the β-Ta film shows a very small stress change with the passage of time due to heating, it is optimum as an X-ray absorbing film for forming an X-ray absorbing pattern to be formed through a thermal treatment process. A β-Ta film having the plane orientation of (002) is formed by making the base material amorphous.

In another method of the present invention, an X-ray absorbing film is heated before patterning it in order to decrease the stress change of the film in patterning and then ions are implanted into the film. This method makes it possible to decrease the stress change of the X-ray absorbing film as compared with the stress change of the film implanted with ions without being heated.

Moreover, an X-ray absorbing film having tensile stress after heated is formed and then the film stress is shifted to the compressive side by heating the film and implanting ions into it to decrease the tensile stress of the film. Thus, an X-ray absorbing film having a film stress of almost zero is finally formed by adjusting in advance the tensile stress after heating the X-ray absorbing film and the stress change of the compressive side by ion implantation.

A pattern of an X-ray mask formed by patterning the X-ray absorbing film has a very small strain and a latent image having a very small error is formed on a resist exposed by using such an X-ray mask.

DESCRIPTION OF THE PREFERRED EMBODIMENTS

Before describing the embodiments, the result of examining the stress change of a heated X-ray absorbing film implanted with argon (Ar) ions without being thermally treated after formed is described below. The X-ray absorber uses Ta.

Figure 3:
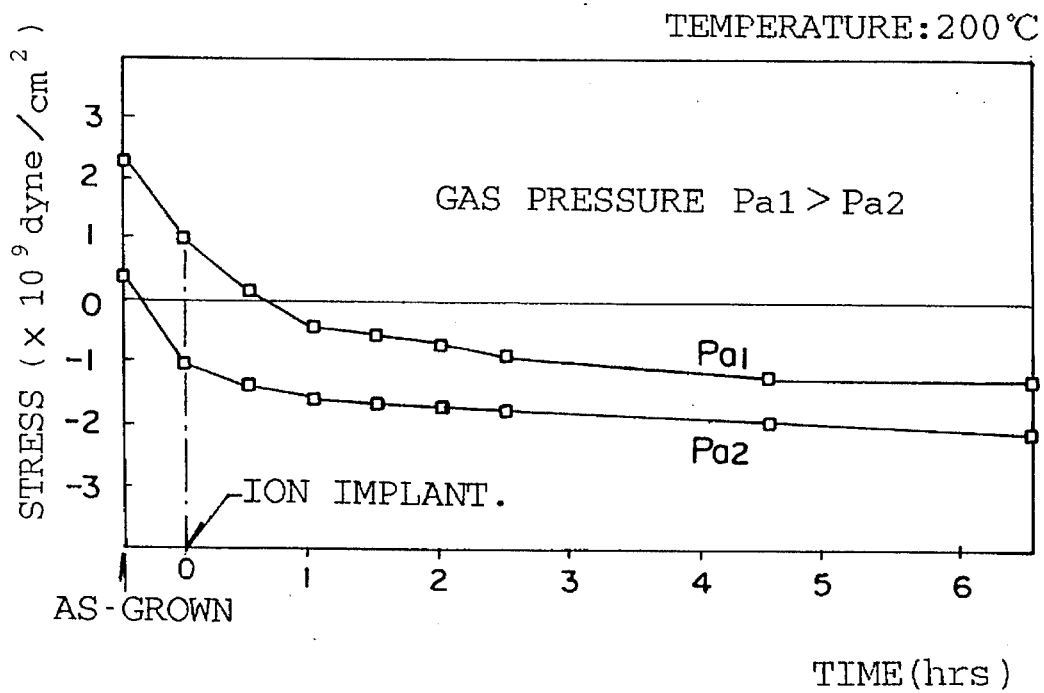
FIG. 3 is an illustration showing the stress of an X-ray absorbing film immediately after formed and the change with the passage of time of the stress of an X-ray absorbing film applied with ion implantation without being heated after formed.

As the result of heating the Ta film implanted with argon ions without being thermally treated after formed at 200° C., the stress is changed with the passage of time as shown in FIG. 3. In this case, the temperature of 200° C. is adopted because there are processes in which a silicon substrate and a support frame are heated at 200° C. to be bonded with each other and photoresist is prebaked at approx. 180° C. for manufacturing an X-ray mask.

Figure 1A:
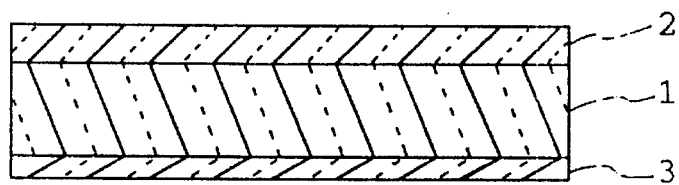
FIGS. 1(a) to 1(e) are sectional views showing a conventional X-ray mask manufacturing process.
Figure 1B:
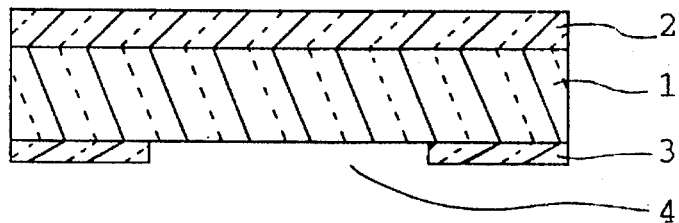
Figure 1C:
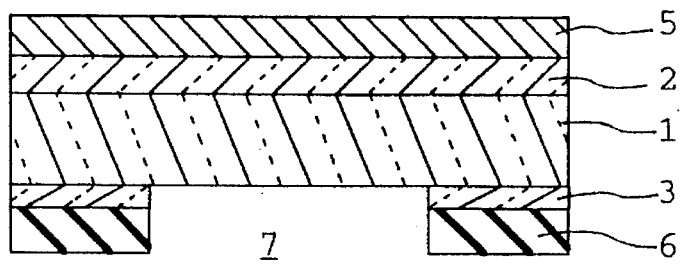
Figure 1D:
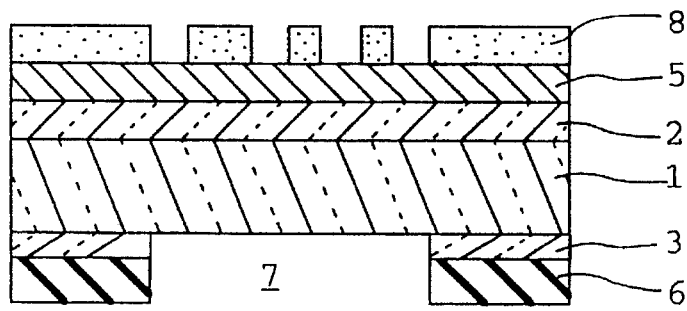
Figure 1E:
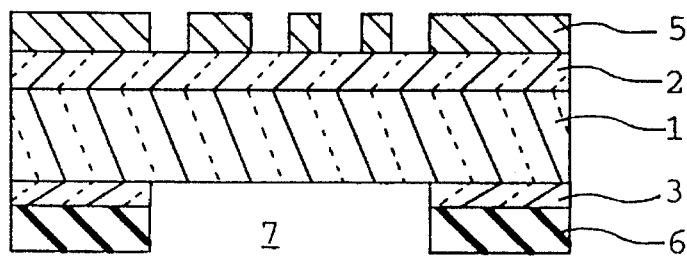
Figure 2:
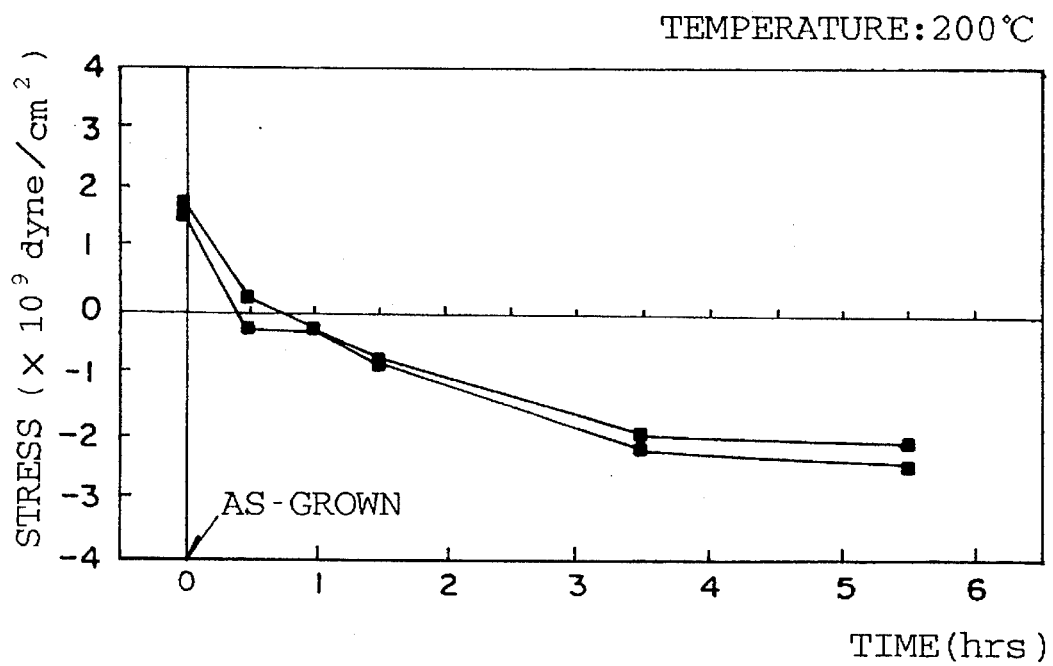
FIG. 2 is an illustration showing the change of stress with the passage of time while an X-ray absorbing film formed on a membrane by a conventional method is heated.

From the result of this experiment, it is found that the stress change decreases as compared with the case where no ion is implanted into the film as shown in FIG. 2.

However, the stress changes as usual in the period between film formation and ion implantation and also it changed at the compressive side due to the heat produced in the X-ray absorbing film when ions are implanted into the film. The stress change from film formation to the moment immediately after ion implantation is approx. $1.4 \times 10^9$ dyn/cm$^2$, and nevertheless, the stress change after ion implantation is kept at approx. $1 \times 10^9$ to $2 \times 10^9$ dyn/cm$^2$. Therefore, it is necessary to further suppress the film stress in order to decrease the strain of the X-ray absorbing pattern.

(1) First embodiment

Figure 4A:
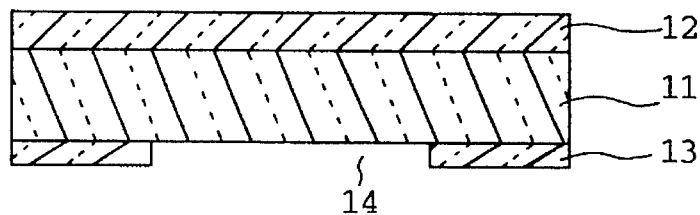
FIGS. 4(a) to 4(e) are sectional views showing the X-ray mask manufacturing process of a first embodiment of the present invention.

FIGS. 4(a) to 4(e) are sectional views showing the manufacturing process of the first embodiment of the present invention. First, as shown in FIG. 4(a), a membrane 12 having a large mechanical strength and a high X-ray resistance is formed in the thickness of several microns on the top surface of a single-crystal silicon (Si) substrate 11 by the low pressure CVD method. Then, after a SiC film 13 is deposited on the underside of the silicon substrate 11 by the same low pressure CVD method, patterning is applied to the SiC film 13 to form an opening 14 for exposing a pattern area at the center of the Si substrate 11.

The SiC membrane 12 and SiC film 13 are polycrystalline or single crystalline. To grow the polycrystal or single crystal, the mixture gas of SiHCl$_3$ and C$_3$H$_8$ is led into a reaction chamber of a CVD system by using hydrogen as a carrier gas and the substrate temperature is set to 1,000° C.

Figure 4B:
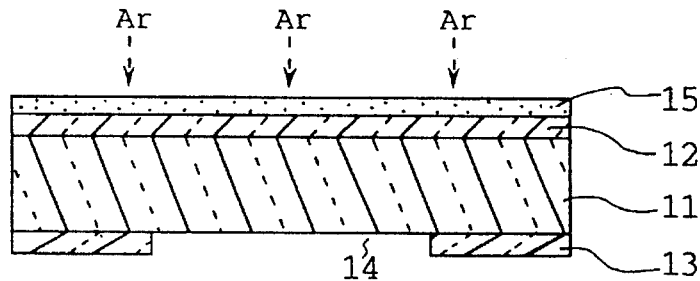

Then, as shown in FIG. 4(b), the membrane 12 is sputtered with argon (Ar) to make the upper layer thereof amorphous and form an amorphous layer 15.

Figure 4C:
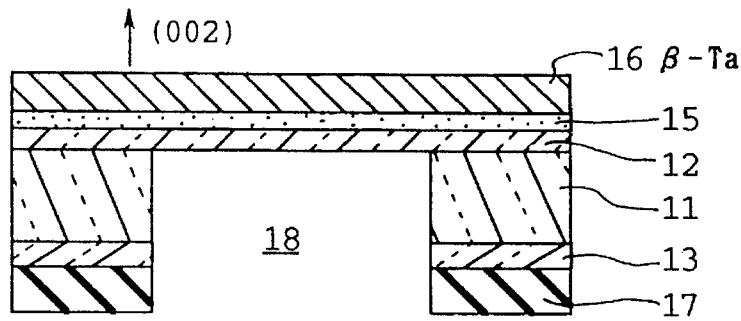

Then, as shown in FIG. 4(c), a Ta film 16 is deposited in the thickness of approx. 0.8 μm on the amorphous layer 15 by the sputtering method. As to the film forming conditions, for example, the sputtering power is set to 1 kW and the gas pressure is set to several mTorr to several tens of mTorr.

A Ta film 16 thus formed becomes β (tetragonal) crystalline tantalum (hereinafter referred as β-Ta) preferentially oriented to the (002) plane, the stress immediately after film formation presents, for example, the state (heating time of 0) shown in FIG. 5 and the stress of the Ta film 16 changes due to the pressure in the reaction chamber when the film is formed.

Then, a support frame 17 having a hole adjusted to the opening 14 of the SiC film 3 is prepared and bonded with the SiC film 13 by using an adhesive to mount the silicon substrate 11 on the support frame 17. When the support frame 17 is bonded with the SiC film 13, pressure is applied to the frame 17 and the film 13 from the outside at the temperature of approx. 200° C. Then, the portion of the silicon substrate 11 exposed through the opening 14 of the SiC film 13 is etched by a mixed solution of hydrofluoric acid and nitric acid. Thereby, a window 8 for exposing the membrane 12 is formed on the silicon substrate 11.

Figure 4D:
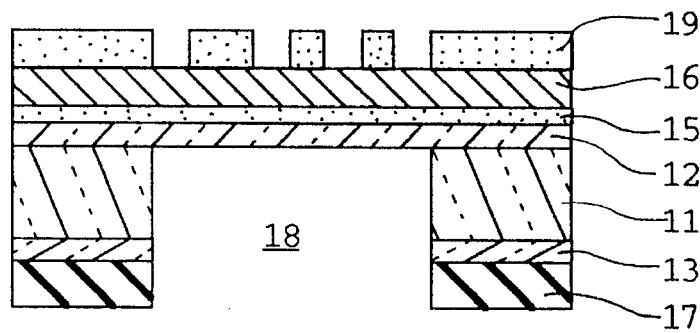
Figure 4E:
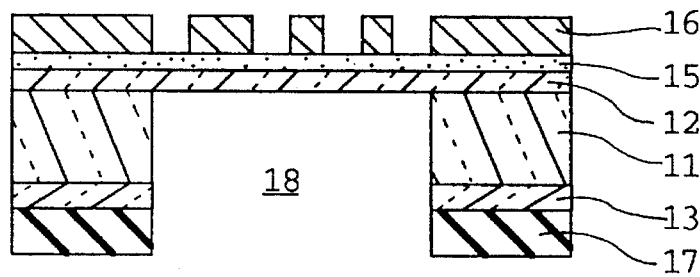

Then, as shown in FIG. 4(d), photoresist 19 is applied onto the Ta film 16, exposed, and developed to form a desired pattern, thereafter patterning is applied to the Ta film 16 by using the pattern of the photoresist 19 as a mask and then removing the photoresist 19. Thus, an X-ray mask is completed.

Figure 5:
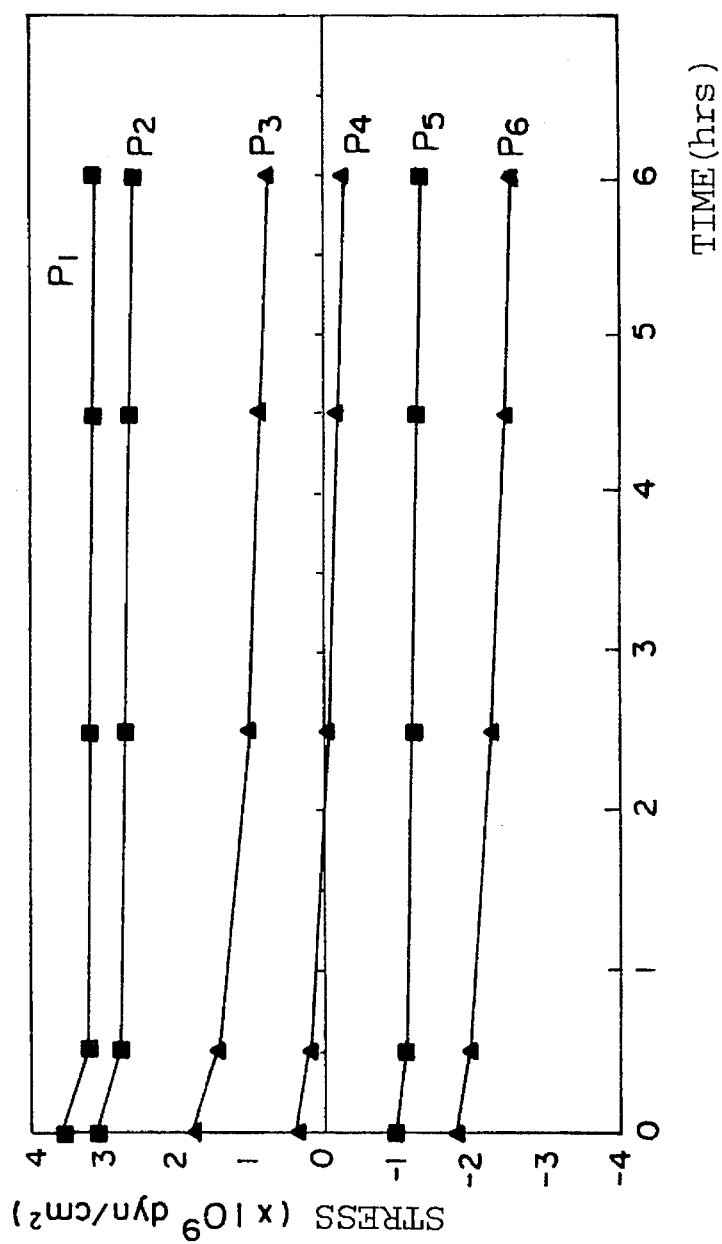
FIG. 5 is an illustration showing the change with the passage of time of the stress of an X-ray absorbing film formed by the method of the first embodiment of the present invention while it is heated.

As described above, as the result of examining the change of the stress of the Ta film 16 formed on the amorphous film 15 of the membrane 12 with the passage of time in the atmosphere at the temperature of 200° C., the change shown in FIG. 5 is observed. The following is the result of comparison between the stress change of the above Ta film 16 and that of a Ta film sputtered with argon after formed which is the prior art.

According to the present embodiment, as shown in FIG. 5, it is found that the stress change is only slightly shifted to the compressive side by approx. $0.5 \times 10^9$ dyn/cm$^2$ for a short time of 30 min and the film stress is stabilized because the stress change is hardly observed even though the film is heated thereafter.

For the Ta film according to the prior art, however, the change of the compressive stress of approx. $2 \times 10^9$ dyn/cm$^2$ 30 min is observed when 30 min elapses after the film is formed, and thereafter, the film stress change increases to approx. $2 \times 10^9$ dyn/cm$^2$.

Therefore, the Ta film 16 formed through the process of the present embodiment makes it possible to preserve a pattern of high-accuracy for a long time without requiring much labor because the stress of the film is not changed due to thermal treatment after forming a mask pattern or the passage of time.

The stress of the film of this embodiment can be controlled by the gas pressure when the film is formed. Therefore, by selecting a gas pressure condition so that the stress comes to zero after heating the Ta film for approx. 30 min, a very accurate X-ray absorbing pattern can be obtained by using the Ta film.

However, because the surface of the membrane 12 sputtered with argon like the present embodiment is flat, it is examined whether the flatness decreases the compressive stress.

Figure 6:
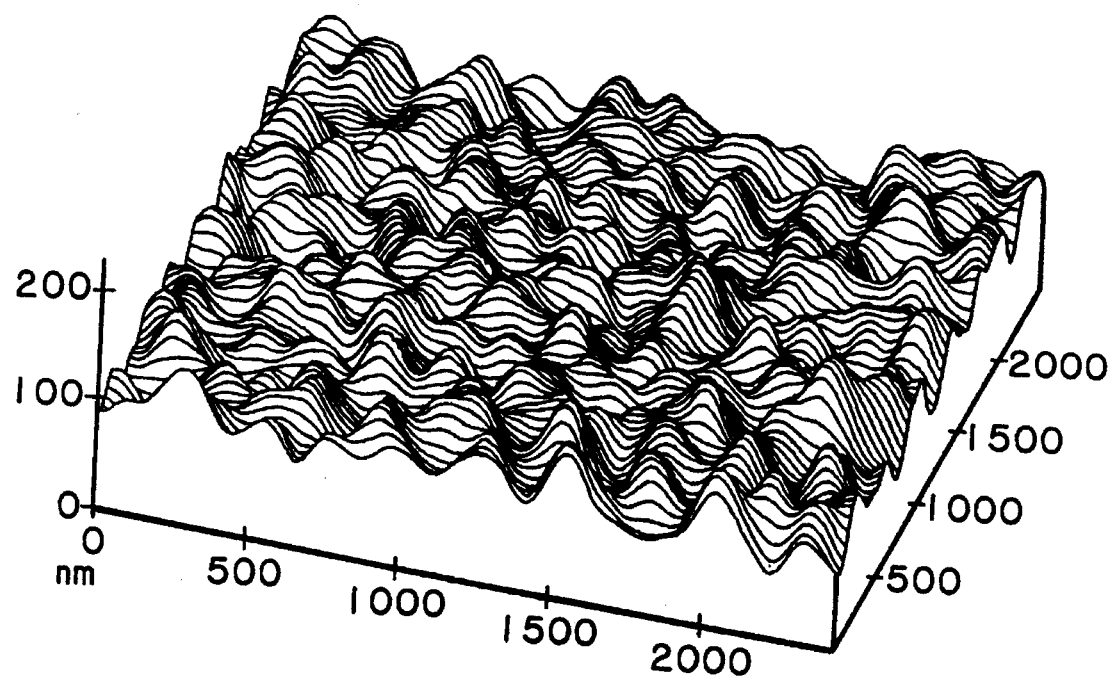
FIG. 6 is an illustration showing the surface state of an amorphous layer of a silicon-carbide membrane of the X-ray mask of the first embodiment of the present invention.
Figure 7:
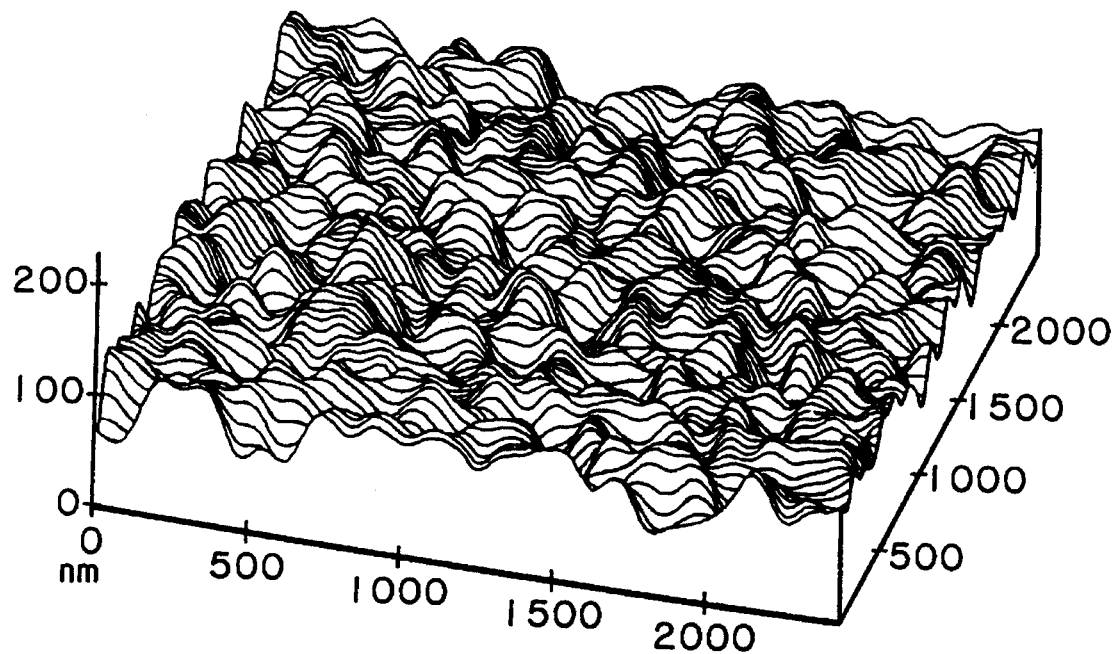
FIG. 7 is an illustration showing the surface state of a silicon-carbide membrane before being made amorphous of the X-ray mask of the first embodiment of the present invention.

First, as the result of observing the surface of the amorphous film 15 formed by making the surface of the SiC membrane 12 amorphous and the flat surface of a single-crystalline or polycrystalline SiC membrane (not illustrated with an AFM (inter-atomic force microscope), the results shown in FIGS. 6 and 7 have been obtained. FIG. 6 shows the surface state of the amorphous layer 5 of the membrane 12 and FIG. 7 shows the surface of the membrane 12 before being made amorphous. From FIGS. 6 and 7, it is found that the non-amorphous membrane surface is slightly superior in point of the flatness.

Then, as the result of depositing a Ta film on each membrane under the same condition and examining the stress, the stress change shown in FIG. 5 was not obtained from the Ta film on the non-amorphous membrane but a characteristic close to that in FIG. 2 was obtained.

Thereby, it is clarified that the cause of the stability of the Ta film 16 is not related to the flatness of the base material. Therefore, it is conceivable that the decrease of stress change depends on the composition peculiar to the β-Ta film oriented to the (002) plane.

In the embodiment described above, the surface of the membrane 2 is made amorphous by Ar sputtering and the Ta film is formed on the membrane. However, inert gases such as Kr and N may be used for sputtering.

Moreover, as a method of forming an amorphous layer, it is also possible to use a method of implanting argon ions or the like into the membrane 12 by the ion implantation method, a method of forming an amorphous silicon oxide film on the surface of the membrane 12 by the thermal oxidation method or CVD method, or a method of forming an amorphous silicon nitride film or a silicon oxide-nitride film on the membrane 12 by the CVD method. As the result of forming a Ta film on these amorphous surfaces, a β-Ta film oriented to the (002) plane was obtained and the change of the compressive stress under heating decreases. The same result is obtained by applying SOG (spin on glass) which is an amorphous film onto the membrane 12.

However, the silicon oxide film has a low X-ray resistance. Therefore, when the silicon oxide film or silicon oxide-nitride film are used as an amorphous layer, it is preferable to apply patterning not only to the β-Ta film but the silicon oxide film or silicon oxide-nitride film into the same shape.

(2) Second embodiment

FIGS. 8(a) to 8(e) are sectional views showing the manufacturing process of a second embodiment of the present invention.

Figure 8A:
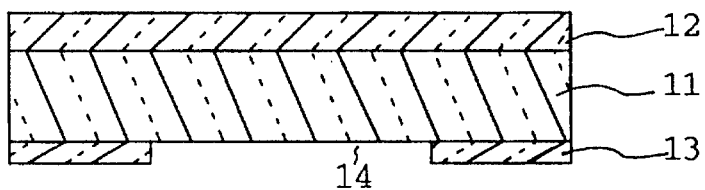
FIGS. 8(a) to 8(e) are sectional views showing an X-ray mask manufacturing process of a second embodiment of the present invention.

First, as shown in FIG. 8(a), after a membrane 12 composed of SiC is formed in the thickness of several microns on a temperature of a silicon (Si) substrate 11 by the low pressure CVD method same as that of the first embodiment, a SiC film 13 is formed on the underside of the silicon substrate 11. Then, an opening 14 for exposing a pattern area at the center of the Si substrate 11 is formed by patterning the SiC film 13 on the underside of the substrate.

Figure 8B:
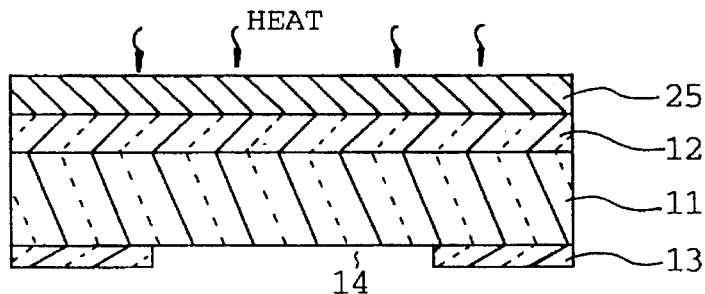

Then, as shown in FIG. 8(b), an X-ray absorbing film 25 made of W, Ta, or an alloy of W and Ta is deposited in the thickness of approx. 8 μm on the membrane 12 by sputtering and the silicon substrate 11 is heated in a not-illustrated furnace at a temperature ranging between 100° and 200° C., preferably at 200° C. for 30 min. The X-ray absorbing film 25 is formed so that tensile stress remains after the film is heated. For example, when the surface of the membrane 12 is made into an amorphous state and the gas pressure is set to 10 mTorr or more, the X-ray absorbing film 25 has tensile stress.

Figure 8C:
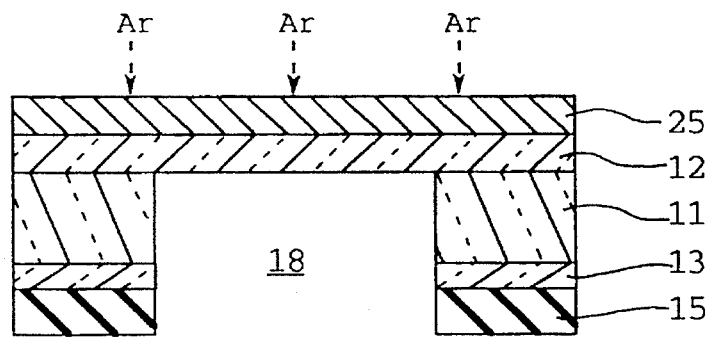

Then, as shown in FIG. 8(c), argon ions are implanted into the X-ray absorbing film 25 under the conditions of the dose of $1 \times 10^{15}$ to $10 \times 10^{15} cm^2$ and the acceleration energy of 150 keV.

Then, similarly to the first embodiment, after a support frame 17 is bonded under the SiC film 13, the Si substrate 11 exposed from the hole of the support frame 17 and the opening 14 of the SiC film 13 is etched to form a window 18. When the support frame 17 is bonded under the SiC film 13, an adhesive is used and they are heated at approx. 200° C.

Figure 8D:
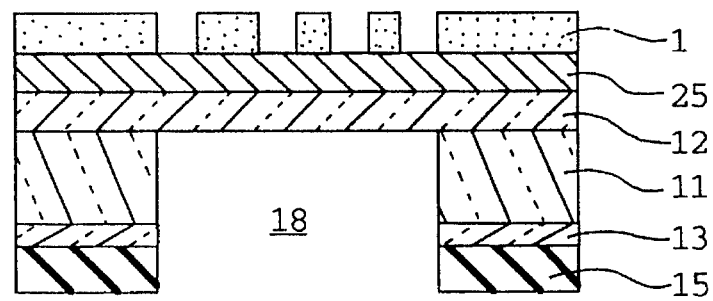

Then, as shown in FIG. 8(d), photoresist 19 is applied onto the film 25 and pre-baked at approx. 180°, and thereafter the photoresist 19 is exposed and developed by using a reticle not illustrated, thereby to form a pattern on the photoresist 19.

Figure 8E:
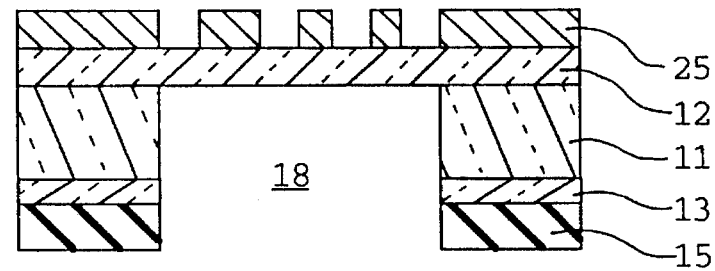

Then, the X-ray absorbing film 25 is etched using the photoresist 19 as a mask to form a pattern. Finally, the photoresist 19 is removed, and the X-ray mask shown in FIG. 8(e) is completed.

Figure 9:
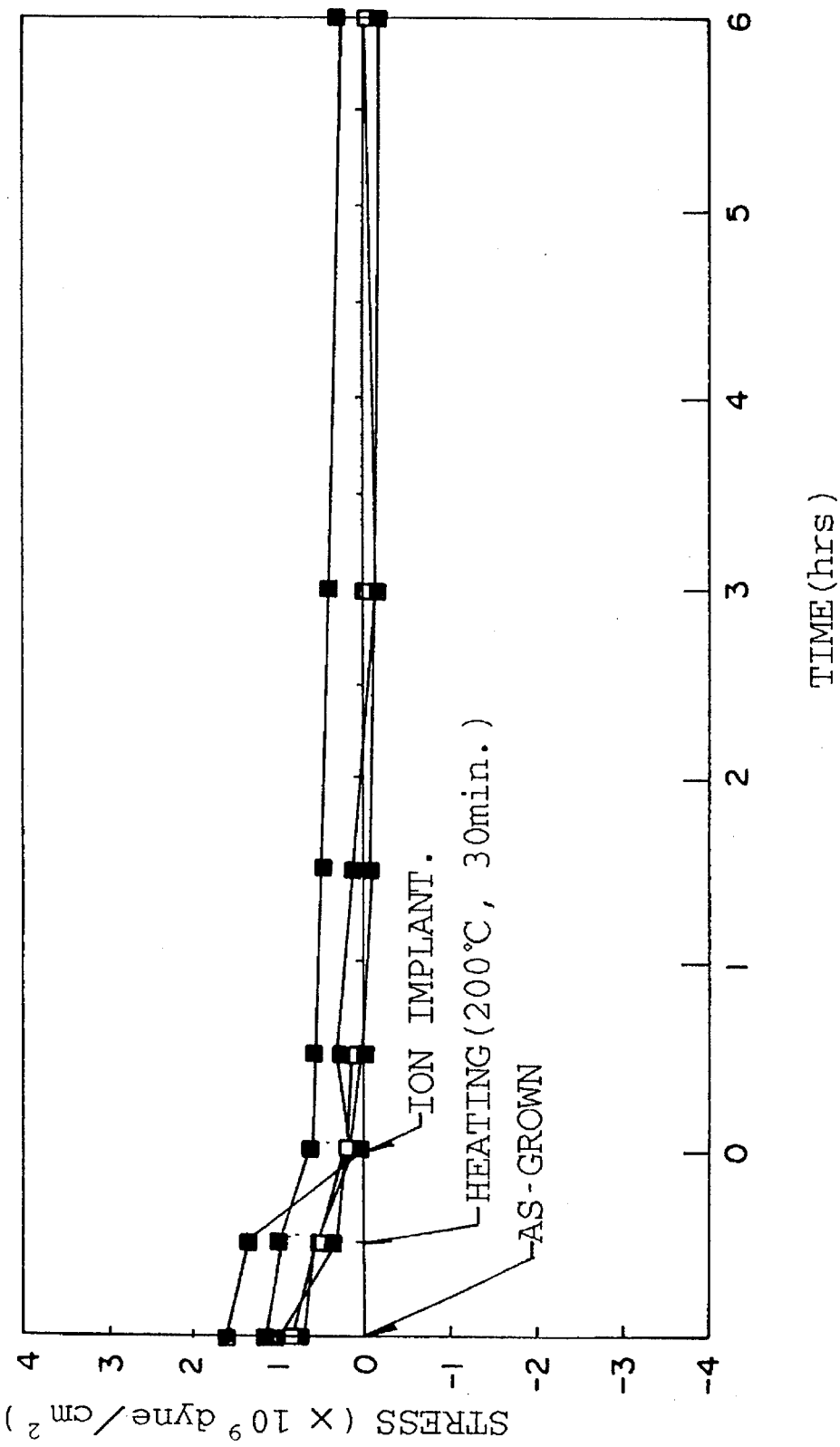
FIG. 9 is an illustration showing the change with the passage of time of the stress of an X-ray absorbing film formed in the second embodiment of the present invention while it is heated.

As the result of heating the substrate 11 as described above and heating the X-ray absorbing film 25 composed of Ta after ion implantation at 200° C. to examine the change of the film with the passage of time, the characteristics shown in FIG. 9 were obtained. Thereby, it is clarified that the stress of the X-ray absorbing film 25 after ion implantation hardly changes and is stabilized with the passage of time by implanting ions into the film after thermally treating it. Thus, the controllability has been improved.

Moreover, from FIG. 9, it is found that the stress of the X-ray absorbing film 25 is slightly shifted to the compressive side from the state after heating due to ion implantation. Therefore, by heating the X-ray absorbing film 25 before setting the stress before ion implantation so that it serves as tensile stress and shifting the stress to the compressive side by ion implantation so that the stress comes to almost zero, the stress is not varied by the change of stress due to heat thereafter or the change with the passage of time. Therefore, the pattern of the X-ray absorber does not change and the pattern shape can be maintained with high accuracy.

Figure 10:
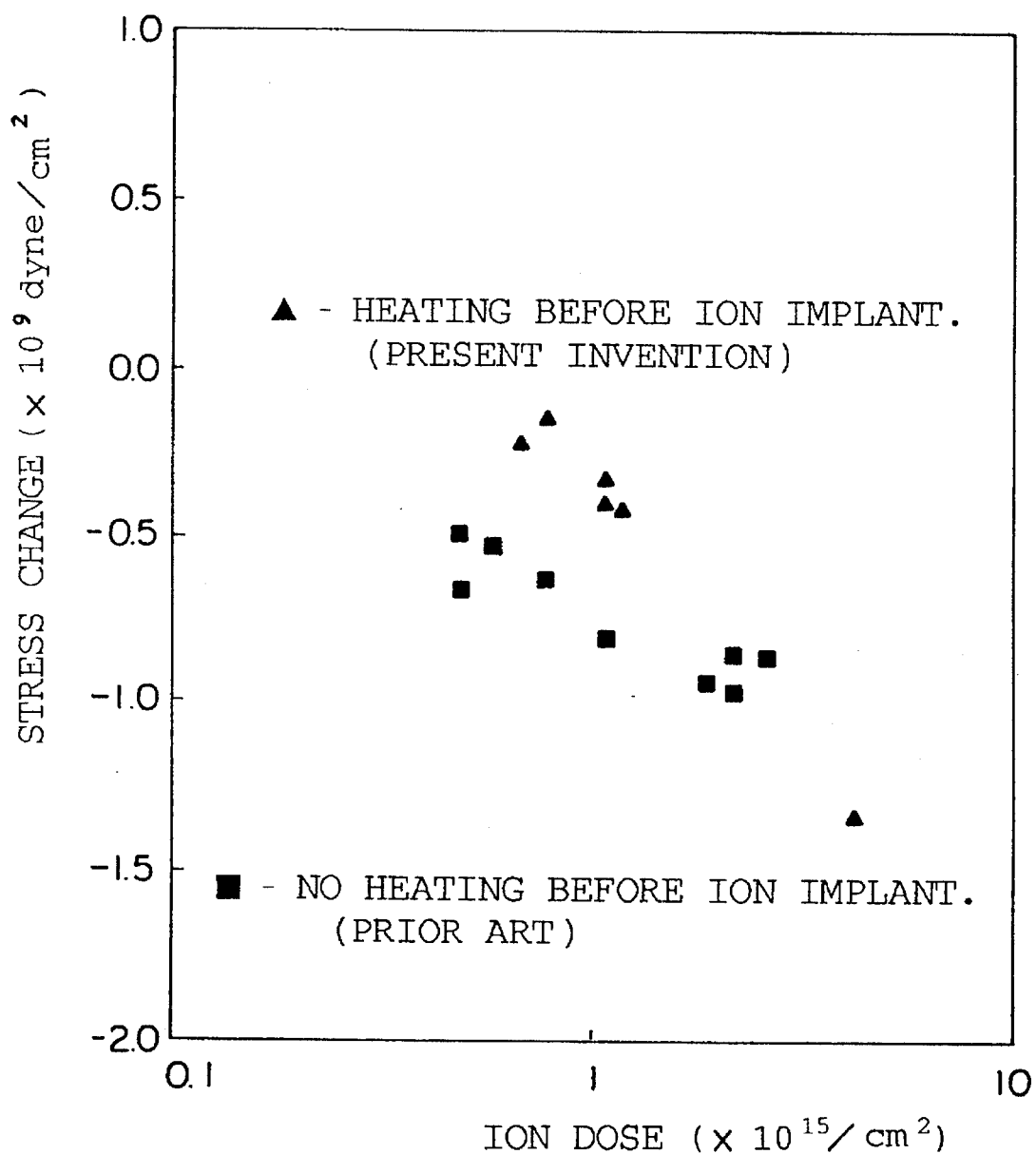
FIG. 10 is an illustration showing the relationship between the ion dose and the stress change of the second embodiment of the present invention and an example of the prior art, respectively.

As the result of examining the relationship between the ion implantation dose and the stress change after heating with respect to the case of the present embodiment in which the X-ray absorbing film 25 is formed under the same condition and thermally treated before ions are implanted into the film and a case in which ions are implanted into the film without thermally treating it, the results shown in FIG. 10 were obtained and it has been found that the present embodiment is smaller in the shift value to the compressive side.

In the above description, the stress of the X-ray absorbing film 25 heated before ion implantation is set so that it serves as tensile stress. However, the pattern is less deformed if the absolute value of the film stress is small even in case of compressive stress and when the stress comes to zero.

Figure 11A:
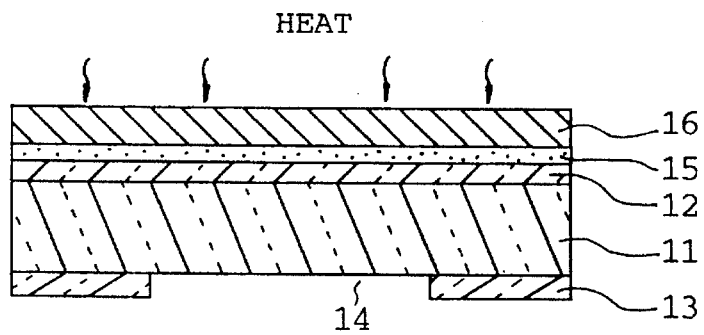
FIGS. 11(a) to 11(c) are sectional views showing an X-ray mask manufacturing process when using an amorphous material for the base material of the X-ray absorbing film of the second embodiment.
Figure 11B:
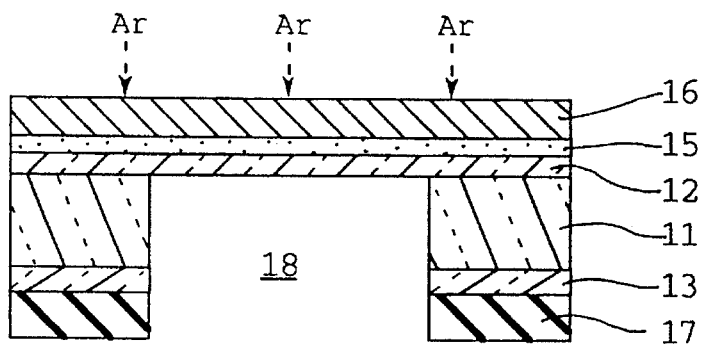
Figure 11C:
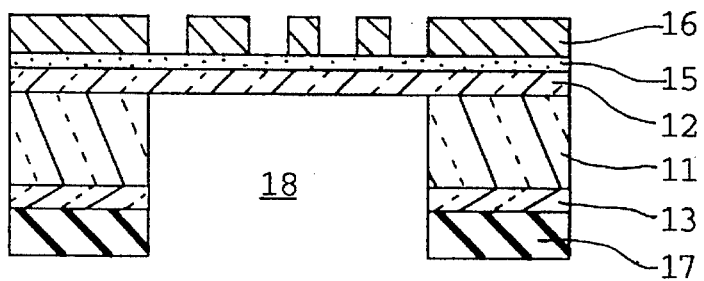

For this embodiment, it is possible to use β-Ta having only a small stress change shown in the first embodiment as an X-ray absorber. For example, as shown in FIG. 11(a), the strain of the pattern formed from the β-Ta film 16 can be controlled to several percent or less of the pattern width as shown in FIG. 11(c) by forming a β-Ta film 16 having the plane orientation of (002) on an amorphous layer 15 using a membrane 12 on whose surface the amorphous layer 15 is formed and then heating the β-Ta film 16 and implanting inactive ions thereafter into the β-Ta film 16 so that the change of the stress of the X-ray absorbing film is further relieved as shown in FIG. 11(b).

(3) Third embodiment

The following is the description of an example of the exposure method using an X-ray mask formed by the above-mentioned manufacturing method.

Figure 12:
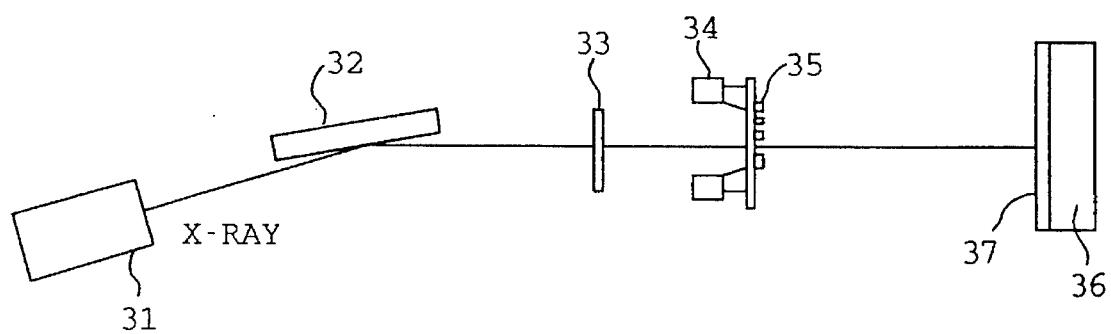
FIG. 12 is a perspective view showing an exposure method of a third embodiment of the present invention.

FIG. 12 is a schematic block diagram showing the X-ray exposure method.

In FIG. 12, X-rays emitted from the X-ray generation source 31 are reflected by the reflector 32 and passes through the filter 33 before entering the X-ray mask 34. The X-ray absorbing pattern 35 of the X-ray mask 34 is formed by the manufacturing method shown in the first or second embodiment.

When X-rays passing through the X-ray mask 34 are applied to the X-ray resist 37 on the wafer 36, a pattern having the same size as the X-ray absorbing pattern 35 or smaller than it is formed on the X-ray resist 37 as an latent image. Then, the X-ray resist 37 is developed to form a resist pattern.

With the exposure using the X-ray mask formed by the above embodiment, an X-ray resist pattern is accurately formed.

What is claimed is:

1. An X-ray mask comprising an X-ray absorbing pattern including β-crystalline tantalum (β-Ta) having the plane orientation of (002).

2. A method of manufacturing an X-ray mask comprising the steps of:

forming an X-ray absorbing film including/β-Ta having the plane orientation of (002) on an amorphous layer made of an X-ray transmission material; and patterning the X-ray absorbing film to form an X-ray absorbing pattern.

3. A method of manufacturing an X-ray mask according to claim 2, wherein said amorphous layer is formed by a silicon carbide film including an inactive element.

4. A method of manufacturing an X-ray mask according to claim 3, wherein the inactive element is any one of argon, krypton, and nitrogen.

5. A method of manufacturing an X-ray mask according to claim 2, wherein said amorphous layer is made of any one of a silicon oxide film, a silicon nitride film, silicon oxide-nitride film, and SOG.

6. A method of manufacturing an X-ray mask according to claim 2, wherein patterning of the X-ray absorbing film includes a heating process at 200° C. or lower.

7. A method of manufacturing an X-ray mask comprising the steps of:

forming an X-ray absorbing film of β-tantalum having the plane orientation of (002);

depositing said X-ray absorbing film on an X-ray transmission film;

heating said X-ray absorbing film and thereafter implanting inactive element ions into said X-ray absorbing film; and 8. A method of manufacturing an X-ray mask according to claim 7, wherein the heating temperature ranges between 100° C. and 300° C.

9. A method of manufacturing an X-ray mask according to claim 7, wherein patterning of said X-ray absorbing film includes a heating process of 200° C. or lower.

10. A method of manufacturing an X-ray mask comprising the steps of:

forming an X-ray absorbing film of β-tantalum having the plane orientation of (002), and forming said X-ray absorbing film having a tensile stress after heated;

shifting the stress of said X-ray absorbing film to the compressive side to decrease the film stress by heating said X-ray absorbing film and implanting inactive element ions into said X-ray absorbing film; and patterning said X-ray absorbing film implanted with ions to form an X-ray absorbing pattern.

11. A method of manufacturing an X-ray mask according to claim 11, wherein the heating temperature ranges between 100° C. and 300° C.

patterning said X-ray absorbing film to form an X-ray absorbing pattern.

12. A method of manufacturing an X-ray mask according to claim 10, wherein patterning of said X-ray absorbing film includes a heating process at 200° C. or lower.

13. An exposure method using an X-ray mask comprising the steps of:

applying X-rays passing through an X-ray mask having an X-ray absorbing pattern composed of β-Ta having the plane orientation of (002), to an X-ray sensitive resist.

* * * * *

UNITED STATES PATENT AND TRADEMARK OFFICE
CERTIFICATE OF CORRECTION

PATENT NO. : 5,541,023
DATED : July 30, 1996
INVENTOR(S) : Kazuaki KONDO et al.

It is certified that error appears in the above-indentified patent and that said Letters Patent is hereby corrected as shown below:

Column 1, line 25, delete "(SIC)" and insert --(SiC)--.

Column 8, line 19, after "and" insert -- patterning said X-ray absorbing film to form an X-ray absorbing pattern--.

Signed and Sealed this

Twelfth Day of November, 1996

Attest:

BRUCE LEHMAN

*Attesting Officer*     *Commissioner of Patents and Trademarks*